유010215810B2

United States Patent
Izawa

(10) Patent No.: US 10,215,810 B2
(45) Date of Patent: Feb. 26, 2019

(54) BATTERY MONITORING SYSTEM

(71) Applicant: YAZAKI CORPORATION, Tokyo (JP)

(72) Inventor: Takaaki Izawa, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/636,961

(22) Filed: Jun. 29, 2017

(65) Prior Publication Data

US 2018/0024198 A1 Jan. 25, 2018

(30) Foreign Application Priority Data

Jul. 21, 2016 (JP) ................. 2016-143138

(51) Int. Cl.
*G01R 31/36* (2006.01)
*H02J 7/00* (2006.01)
(Continued)

(52) U.S. Cl.
CPC ......... *G01R 31/3606* (2013.01); *G01R 31/36* (2013.01); *G01R 31/3648* (2013.01); *G01R 31/3658* (2013.01); *G01R 31/3689* (2013.01); *H01M 10/425* (2013.01); *H01M 10/0562* (2013.01); *H01M 10/48* (2013.01); *H01M 2010/4271* (2013.01); *H01M 2010/4278* (2013.01)

(58) Field of Classification Search
CPC .................................................. H02J 7/0025
USPC ........................................ 320/132
See application file for complete search history.

(56) References Cited

U.S. PATENT DOCUMENTS

2012/0139553 A1* 6/2012 Nortman ............... H02J 7/0016
324/537
2012/0176160 A1 7/2012 Sugimura
(Continued)

FOREIGN PATENT DOCUMENTS

| JP | 2012147587 A | 8/2012 |
| JP | 2013-024800 A | 2/2013 |
| JP | 2015001446 A | 1/2015 |

OTHER PUBLICATIONS

Office Action dated Aug. 28, 2018 in counterpart Japanese Patent Application No. 2016-143138 with English translation.

*Primary Examiner* — Suchin Parihar
(74) *Attorney, Agent, or Firm* — Sughrue Mion, PLLC

(57) ABSTRACT

A battery monitoring system includes: an input circuit to which voltage signals of battery cells are inputted; a multiplexer selecting a battery cell for voltage detection from the battery cells, selecting voltage signals inputted from the input circuit, and outputting the selected voltage signals; first and a second voltage measuring circuits simultaneously measuring voltages based on the voltage signals in first and second routes outputted from the multiplexer; a comparator comparing measurement results by the first voltage measuring circuit and by the second voltage measuring circuit; and a control unit that judges, on a basis of a comparison result by the comparator, at least one of a voltage of each battery cell, an operation check of equalizing the voltages of the battery cells, a presence or absence of a disconnection of a detection line of each battery cell, and a presence or absence of a failure in the multiplexer.

5 Claims, 13 Drawing Sheets

(51) Int. Cl.
*H01M 10/42* (2006.01)
*H01M 10/48* (2006.01)
*H01M 10/0562* (2010.01)

(56) References Cited

U.S. PATENT DOCUMENTS

| | | | |
|---|---|---|---|
| 2014/0152261 A1* | 6/2014 | Yamauchi | B60L 11/1866 320/118 |
| 2015/0077124 A1* | 3/2015 | Suzuki | G01R 35/00 324/426 |
| 2016/0131718 A1 | 5/2016 | Sugimura et al. | |
| 2018/0024201 A1* | 1/2018 | Izawa | B60L 3/0046 324/434 |

* cited by examiner

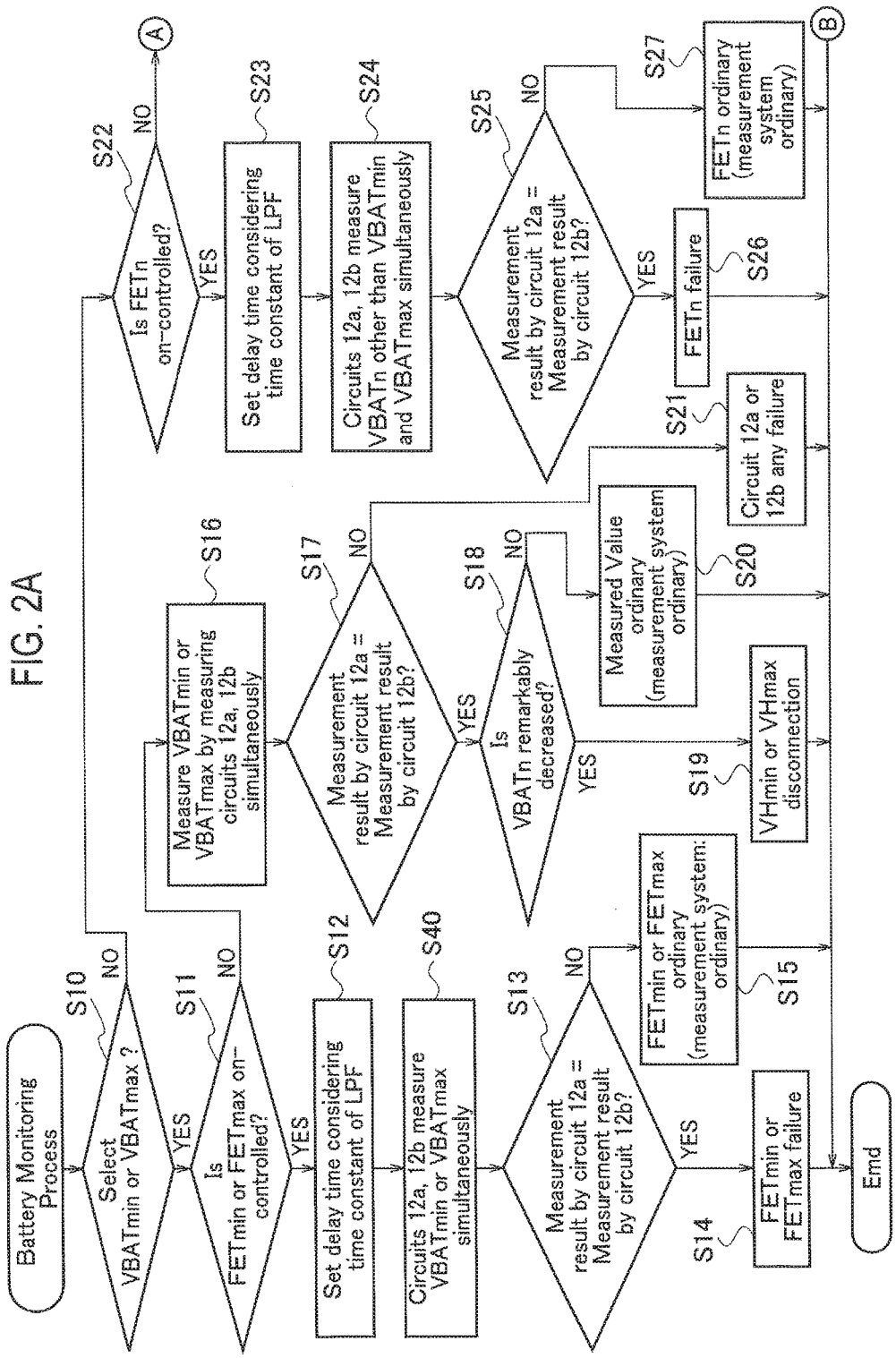

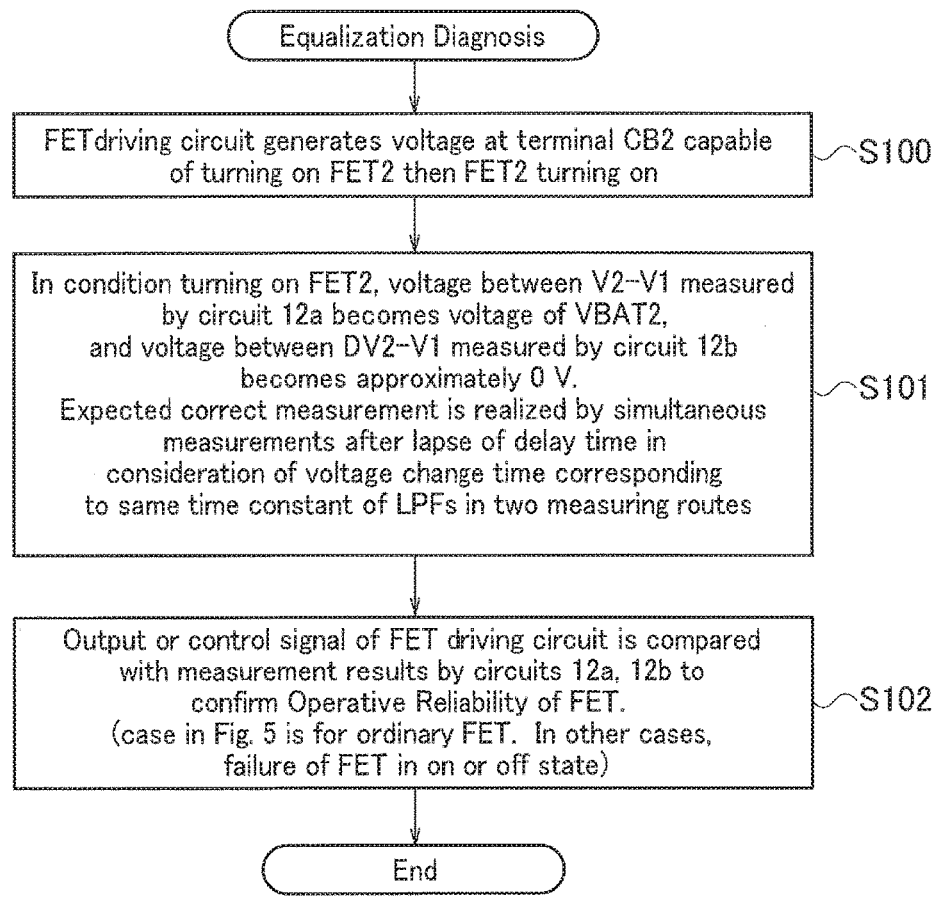

BATTERY MONITORING SYSTEM

CROSS REFERENCE TO RELATED APPLICATION

The present application is based on, and claims priority from Japanese Patent Application No. 2016-143138, filed Jul. 21, 2016, the disclosure of which is hereby incorporated by reference herein in its entirety.

TECHNICAL FIELD

The present application relates to a battery monitoring system for monitoring the states of battery cells constituting a battery pack.

BACKGROUND ART

In a hybrid vehicle, an electric vehicle, or the like, a driving power is obtained since a motor is driven by electric power accumulated in a secondary battery such as a lithium ion battery or a nickel hydrogen battery.

In such a secondary battery, for example, a plurality of battery cells are mutually connected in series, thereby forming a battery pack.

With charge to and discharge from respective battery cells performed repeatedly, the battery pack gradually deteriorates over time and additionally, the output voltage of each battery cell changes.

Also, in the battery pack, the output voltage of each battery cell also changes due to a load variation, such as a change in the running state of a vehicle, or a disturbance such as a change in temperature or humidity.

In a case of the battery pack using lithium ion batteries, particularly, it is necessary to monitor the voltage and the like of each battery cell accurately to suppress overcharging to and overdischarging from each battery cell and therefore, techniques related to battery monitoring have been proposed (see PTL1 (JP 2013-024800 A)).

As illustrated in FIG. 12, a voltage detection device 520 of a conventional example described in PTL1 includes multiplexers 540, 541 that selectively connect any one of respective battery cells 511 of a battery pack 510 where the battery cell 511 is connected in series, and a plurality of voltage detection means 550, 551 for detecting the cell voltages as the output voltages of the multiplexers 540, 541.

Additionally, the voltage detection device 520 includes switching means 530 for switching the operation between a first mode where the respective voltage detection means 550, 551 detect the cell voltages of different battery cells 511 and a second mode where the respective voltage detection means 550, 551 detect the cell voltage of an identical battery cell 511.

With the voltage detection device 520 having such a configuration, a measurement error between measuring circuits is suppressed even if a voltage waveform of the battery cell varies under the influence of a load variation or the like as illustrated in FIG. 13.

That is, in the voltage detection device 520 of the conventional example, it is contemplated that the measurement accuracy can be improved since the two voltage detection means 550, 551 simultaneously measure the voltage of the same battery cell (i.e. synchronization of respective measurements at different timings t1, t2 of FIG. 13).

SUMMARY

However, the voltage detection device of the conventional example has the following disadvantages.

That is, there is a case that the voltages of respective battery cells constituting the battery pack are approximately the same when a vehicle etc. is under actual use conditions.

In such a case, if the multiplexer is broken and always brought into a deadlocked condition where the multiplexer is always connected with an identical battery cell, it is difficult to find a failure of the voltage detection device itself since the detected voltage itself is not substantially different from the ordinary value. In the worst case, there is a problem that the occurrence of a failure may not be noticed.

If such a problem arises, it is impossible to measure voltages of respective battery cells accurately, so that each battery cell may be overcharged or overdischarged to cause a trouble of hastening the deterioration of a battery pack or the like Further, the voltage detection device of the conventional example has also a trouble that the operation of equalizing the voltages of respective battery cells cannot be confirmed easily.

Additionally, the voltage detection device of the conventional example has also a trouble that a disconnection in a voltage detection line of each battery cell cannot be detected easily.

In consideration of the above-mentioned problems to be solved, an object of the present application is to provide a battery monitoring system capable of detecting the voltages of respective battery cells constituting a battery pack with high accuracy and also performing, with relatively simple processing, both an operation check of equalizing the voltages of respective battery cells and a detection of a disconnection in the voltage detection line of each battery cell.

According to an aspect of the present application, there is provided a battery monitoring system for monitoring a state of a battery pack including n (n: an integer) pieces of battery cells connected in series over a plurality of stages, including: an input circuit to which respective voltage signals of the battery cells are inputted; a multiplexer configured to select a battery cell for voltage detection from the n pieces of battery cells, select voltage signals inputted from the input circuit, and output the selected voltage signals; a first voltage measuring circuit configured to measuring a voltage based on a voltage signal in a first route outputted from the multiplexer; a second voltage measuring circuit configured to measuring a voltage based on a voltage signal in a second route outputted from the multiplexer, at the same time as measurement of the first voltage measurement circuit; a comparator configured to compare a measurement result by the first voltage measuring circuit with a measurement result by the second voltage measuring circuit; and a control unit configured on a basis of a comparison result by the comparator to judge at least one of: a voltage of the each battery cell; an operation check of equalizing the voltages of the respective battery cells; a presence or absence of a disconnection of a detection line of the each battery cell; and a presence or absence of a failure in the multiplexer.

The input circuit may include: n pieces of FETs constituting equalization switches for equalizing the voltages of each of the battery cells; n pieces of resistors for equalization, each of which is connected between a drain terminal side of each of the FETs and a positive side of each of the battery cells; n pieces of first monitor terminals, each of which is connected to a connection point between each of the resistors and the positive side of each of the battery cells and to which the voltage signals in the first route are inputted; and n pieces of second monitor terminals, each of which is connected to a connection point between the drain terminal side of each of the FETs and each of the resistors and to which the voltage signals in the second route are inputted, the first voltage measuring circuit is configured to measure, as the voltage in the first mute, a voltage between a terminal of a ground potential and a lowermost stage of the first monitor terminal or a voltage between adjacent upper and lower stages of the first monitor terminals, and the second voltage measuring circuit is configured to measure, as the voltage in the second route, a voltage between the terminal of a ground potential and a lowermost stage of the second monitor terminals or a voltage between adjacent lower stage of the first monitor terminals and upper stage of the second monitor terminals The input circuit may further include n pieces of drive terminals each of which is connected to a gate side of each of the FETs. A driving unit including a FET drive circuit and a disconnection detecting sink circuit may be connected to the drive terminals, and controlled by the control unit.

Each of the second monitor terminals may be configured: input a voltage different from a voltage inputted to corresponding first monitor terminal when corresponding FET is turned on by the driving unit, and input the same voltage as a voltage that appears on corresponding first monitor terminal on a stage to which corresponding second monitor terminal belongs, when corresponding FET is turned off by the driving unit.

The battery monitoring system may further include low pass filters each arranged on an upstream side of each of the first monitor terminals and an upstream side of each of the second monitor terminals, wherein each of the low pass filters has same time constant.

With the aspect of the present application, it is possible to provide a battery monitoring system capable of detecting the voltages of respective battery cells constituting a battery pack with high accuracy and also performing, with relatively simple processing, both an operation check of equalizing the voltages of respective battery cells and a detection of a disconnection in the voltage detection line of each battery cell.

BRIEF DESCRIPTION OF DRAWINGS

FIGS. 2A and 2B illustrate a flowchart illustrating processing procedure of a battery monitoring process executed in the battery monitoring system according to the embodiment.

FIG. 4 is a flowchart illustrating processing procedure of an equalization diagnosis process executed in the battery monitoring system according to the embodiment.

FIG. 5 is a table illustrating judgment results of the equalization diagnosis process illustrated in FIG. 4.

FIG. 13 is a graph illustrating a voltage waveform of a battery cell under the influence of a load fluctuation or the like.

DESCRIPTION OF EMBODIMENTS

A battery monitoring system S1a according to an embodiment will be described with reference to FIGS. 1 and 2.

Figure 1:
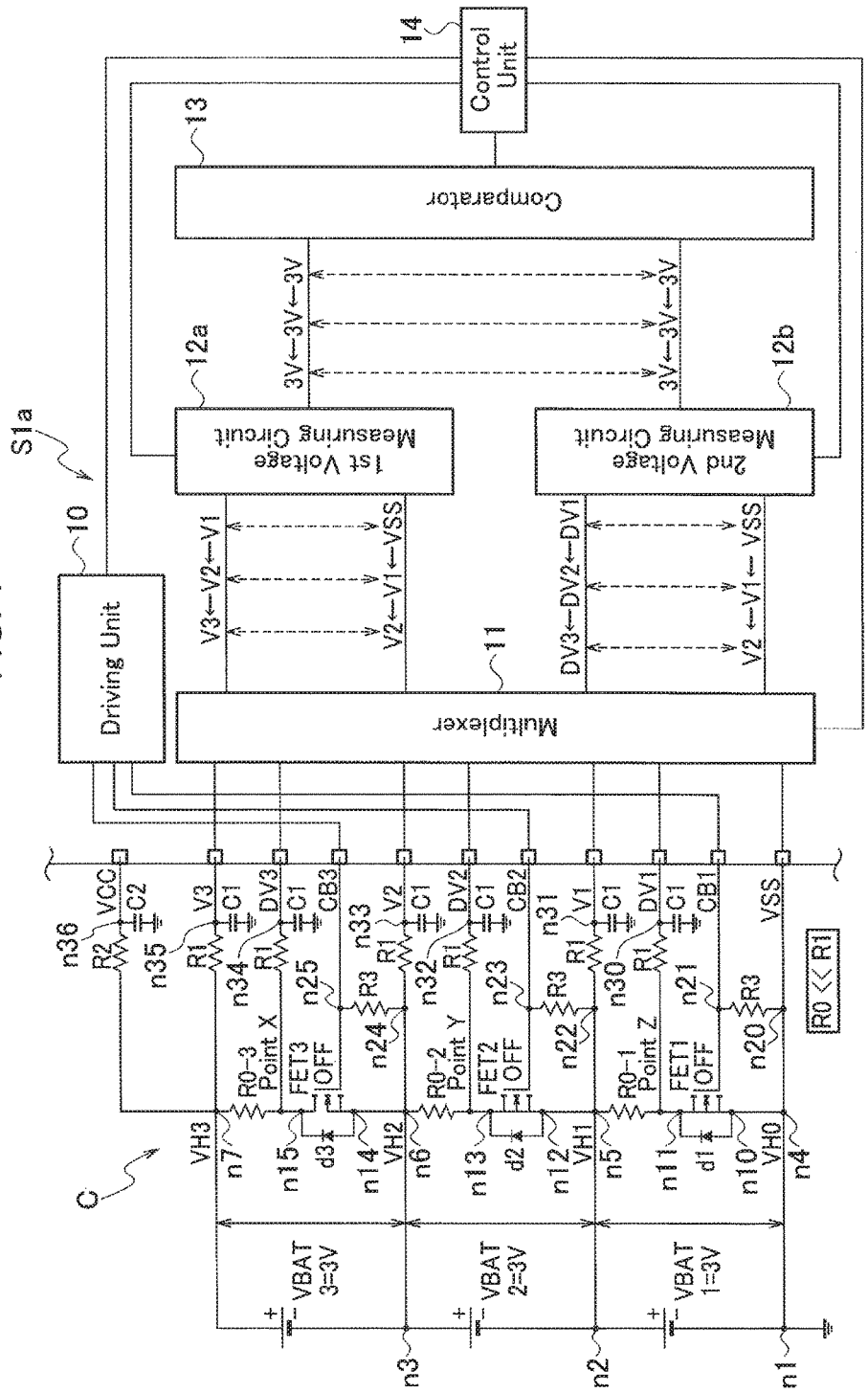
FIG. 1 is a circuit diagram illustrating an overall configuration of a battery monitoring system according to an embodiment.

As illustrated in FIG. 1, the battery monitoring system S1a includes a battery pack consisting of n (n: an integer) battery cells VBATn (VBAT1 to VBAT3) constructed by lithium ion batteries or the like to be monitored, an input circuit C for detecting voltages of the battery cells VBAT1 to VBAT 3, a driving unit 10 including an FET driving circuit for driving FETs in the input circuit C and a disconnection detecting sink circuit, two voltage measuring circuits (i.e. a first voltage measuring circuit 12a and a second voltage measuring circuit 12b), a multiplexer 11 for selecting voltage values (voltage signal in a first route and voltage signal of a second route) to be inputted to the respective voltage measuring circuits 12a, 12b, a comparator 13 for comparing output values from the respective voltage measuring circuits 12a, 12b, and a control unit 14 constructed by a microcomputer or the like for controlling the multiplexer 11, the respective voltage measuring circuits 12a, 12b, and the like.

Based on the comparison result by the comparator 13, the battery monitoring system S1a confirms the voltage of each battery cell VBATn and equalizing operation of the voltage of each battery cell VBATn, and judges the presence/absence of a disconnection of the input circuit C and the presence/absence of a failure of the multiplexer 11. The detailed judgment process by the battery monitoring system S1a will be described later.

The battery monitoring system S1a may be modularized and mounted on one LSI chip. Alternatively, only the input circuit C may be provided in the form of an LSI circuit.

Although the configuration example illustrated in FIG. 1 illustrates three battery cells VBAT1 to VBAT3 as the battery cells VBATn to be monitored for ease of explanation, they may comprise any number (n) of battery cells without being limited by this.

As illustrated in FIG. 1, schematically, the input circuit C includes FETn (n: an integer corresponding to the number of batteries) as equalization switches for equalizing the voltages of the respective battery cells VBATn, equalization resistors R0-1 to R0-3 each connected between the drain-terminal side of each FETn and the positive side of each battery cell, n first monitor terminals Vn (V1 to V3) which are connected to connection points (nodes n5, n6, n7)

between the resistors R0-1 to R0-3 and the positive sides of the respective battery cells VBATn and to which the voltages in the first route are inputted, and n second monitor terminals DVn (DV1 to DV3) which are connected to connection points (points X, Y, and Z) between the drain-terminal sides of the respective FETn and the resistors R0-1 to R0-3 and to which the voltages in the second route are inputted.

The first voltage measuring circuit 12a is configured so as to measure, as the voltage in the first route, a voltage between a terminal VSS of a ground potential and the first monitor terminal V1 of the lowermost stage or a voltage between the respective first monitor terminals V1, V2 (or V2, V3) of the upper and lower adjacent stages. Similarly, the second voltage measuring circuit 12b is configured so as to measure, as the voltage in the second route, a voltage between the terminal VSS of a ground potential and the second monitor terminal DV1 of the lowermost stage or a voltage between the first monitor terminal V1 (or V2) and the second monitor terminal DV2 (or DV3) of the upper and lower adjacent stages.

The input circuit C includes n drive terminals CBn (CB1 to CB3) each connected to the gate of each FETn. Connected to each drive terminal CBn is the driving unit 10 which includes an FET driving circuit and a disconnection detecting sink circuit and whose operation is controlled by the control unit 14.

Inputted to the second monitor terminal DVn (DV1 to DV3) when the FETn is turned on by the driving unit 10 is a voltage that is obtained by subtracting a voltage drop generated at the resistor R0-n from the voltage of the battery cell VBATn of the stage to which the relevant second monitor terminal DVn belongs. Also inputted to second monitor terminal DVn when the FETn is turned off by the driving unit 10 is the same voltage as a voltage appearing at the first monitor terminal Vn of the stage to which the relevant second monitor terminal DVn belongs.

On the upstream side of the first monitor terminal Vn and the second monitor terminal DVn, there are provided low-pass filters (LPFs) having the same time constant.

Next, a concrete configuration example of the input circuit C will be described with reference to FIG. 1.

First, on the first stage, the resistor R0-1 and the FET1 constituting an equalization switch are connected in parallel to the battery cell VBAT1 between a node n1 and a node n2, through the node n5, the point Z, a node n11, a node n10, and a node n4. A negative side of the battery cell VBAT1 is connected to the node n1, while a positive side of the battery cell VBAT1 is connected to the node n2.

A parasitic diode d1 is formed between the node n11 and the node n10.

A source terminal of the FET1 is connected to the node n10 side, while a drain terminal of the FET1 is connected to the node n11 side.

A resistor R3 is connected between the terminal VSS (a ground potential) as one connection terminal with the multiplexer 11 and the drive terminal CB1 of the FET1, through a node n20 and a node n21.

The drive terminal CB1 of the FET1 is connected to the gate terminal of the FET1 through the node n21.

A resistor R1 and a capacitor C1 are connected to the first monitor terminal V1 which forms one connection terminal with the multiplexer 11 and serves to detect a cell voltage of the battery cell VBAT1, through a node n31.

The resistor R1 has one end connected to the positive side of the battery cell VBAT1 through a node n22, the node n5, and the node n2.

Another resistor R1 and another capacitor C1 are connected to the second monitor terminal DV1 which forms one connection terminal with the multiplexer 11 and serves to detect the drain voltage of the FET1, through a node n30.

Next, on the second stage, the resistor R0-2 and the FET2 constituting an equalization switch are connected in parallel to the battery cell VBAT2 between the node n2 and a node n3, through the node n6, the point Y, a node n12, a node n13, and the node n5. A negative side of the battery cell VBAT2 is connected to the node n2, while a positive side of the battery cell VBAT2 is connected to the node n3.

A parasitic diode d2 is formed between the node n13 and the node n12.

A source terminal of the FET2 is connected to the node n12 side, while a drain terminal of the FET2 is connected to the node n13 side.

A resistor R3 is connected between the first monitor terminal V1 as one connection terminal with the multiplexer 11 and the drive terminal CB2 of the FET2, through a node n22 and a node n23.

The drive terminal CB2 of the FET2 is connected to the gate terminal of the FET2 through the node n23.

A resistor R1 and a capacitor C1 are connected to the first monitor terminal V2 which forms one connection terminal with the multiplexer 11 and serves to detect a cell voltage of the battery cell VBAT2, through a node n33.

The resistor R1 has one end connected to the positive side of the battery cell VBAT2 through a node n24, the node n6, and the node n3.

Another resistor R1 and another capacitor C1 are connected to the second monitor terminal DV2 which forms one connection terminal with the multiplexer 11 and serves to detect the drain voltage of the FET2, through a node n32.

Next, on the third stage, the resistor R0-3 and the FET3 constituting an equalization switch are connected in parallel to the battery cell VBAT3 between the node n3 and a node n7, through the node n7, the point X, a node n15, a node n14, and the node 6. A negative side of the battery cell VBAT3 is connected to the node n3, while a positive side of the battery cell VBAT3 is connected to the node n7.

A parasitic diode d3 is formed between the node n15 and the node n14.

A source terminal of the FET3 is connected to the node n14 side, while a drain terminal of the FET3 is connected to the node n15 side.

A resistor R3 is connected between the first monitor terminal V2 as one connection terminal with the multiplexer 11 and the drive terminal CB3 of the FET3, through a node n24 and a node n25.

The drive terminal CB3 of the FET3 is connected to the gate terminal of the FET3 through the node n25.

A resistor R1 and a capacitor C1 are connected to the first monitor terminal V3 which forms one connection terminal with the multiplexer 11 and serves to detect a cell voltage of the battery cell VBAT3, through a node n35.

The resistor R1 has one end connected to the positive side of the battery cell VBAT3 through the node n7.

Another resistor R1 and another capacitor C1 are connected to the second monitor terminal DV3 which forms one connection terminal with the multiplexer 11 and serves to detect the drain voltage of the FET3, through a node n34.

A resistor R2 is provided between the node n7 and a terminal VCC of a driving power supply. A capacitor C2 is connected to one end of the resistor R2 through a node n36.

Here, although each output voltage of the battery cells VBAT1 to VBAT3 is set to 3 V of rating in the illustrated embodiment, it is not limited to this.

Additionally, although the input circuit C illustrated in FIG. 1 illustrates three battery cells VBAT1 to VBAT3 as the battery cells VBATn to be monitored (detected), they may comprise any number (n: an integer) of battery cells without being limited by this.

Then, according to the number (n) of battery cells VBAT, the input circuit C is provided with the first monitor terminals Vn (n: an integer) and the second monitor terminals DVn (n: an integer) are provided in.

The first voltage measuring circuit 12a and the second voltage measuring circuit 12b are operated by the same clock for the purpose of perfectly synchronizing the operational timings of both circuits 12a, 12b.

For the first voltage measuring circuit 12a and the second voltage measuring circuit 12b, there are used circuits having the same characteristics.

The resistance values of the resistors R0 (R0-1 to R0-3) are selected so as to be extremely smaller than the resistance value of the resistor R1.

Consequently, the first monitor terminals Vn and the second monitor terminals DVn are connected to the external low pass filters (LPFs) each composed of the resistor R1 and the capacitor C1 and having similar time constant. Thus, by adjusting the time constant of the low pass filters, it is possible to suppress the voltage fluctuation.

In FIG. 1, reference symbols VH0 to VH3 denote detection lines for detecting respective voltages of the battery cells VBAT1 to VBAT3. There are provided (n+1) detection lines corresponding to the number (n) of battery cells VBAT.

The first voltage measuring circuit 12a measures, as the voltage in the first route, a voltage between the terminal VSS of a ground potential and the first monitor terminal V1 on the lowermost stage or a voltage between the respective first monitor terminals Vn (V1-V2, V2-V3) of the upper and lower adjacent stages. The second voltage measuring circuit 12b measures, as the voltage in the second route, a voltage between the Terminal VSS of a ground potential and the second monitor terminal DV1 of the lowermost stage or a voltage between the first monitor terminal Vn (V1 or V2) and the second monitor terminal DVn+1 (DV2 or DV3) of the upper and lower adjacent stages.

The voltage of the battery cell VBAT1 is detected as a potential between a ground potential VH0 and a positive potential VH1. The voltage of the battery cell VBA 2 is detected as a potential between the potential VIII and a potential VH2. The voltage of the battery cell VBAT3 is detected as a potential between the potential VH2 and the potential VH3.

The situation where the FETn (FET1 to FET3) constituting an equalization switch is controlled by the driving unit 10 controlled by the control unit 14 will be described below.

When the FET1 is turned off, the same voltage appears on the first monitor terminal V1 and the second monitor terminal DV1.

On the other hand, when the FET1 is turned on, a cell potential of the battery cell VBAT1 appears on the first monitor terminal V1, while a voltage (approximately VSS) obtained by subtracting a voltage drop generated at the resistor R0-n from the cell potential appears on the second monitor terminal DV1.

Similarly, when the FET2 is turned off, the same voltage appears on the first monitor terminal V2 and the second monitor terminal DV2. When the FET2 is turned on, a cell potential of the battery cell VBAT2 appears on the first monitor terminal V2, while a voltage (approximately V1) obtained by subtracting a voltage drop generated at the resistor R0-n from the cell potential appears on the second monitor terminal DV2.

Further, when the FET3 is turned off, the same voltage appears on the first monitor terminal V3 and the second monitor terminal DV3. When the FET3 is turned on, a cell potential of the battery cell VBAT3 appears on the first monitor terminal V3, while a voltage (approximately V2) obtained by subtracting a voltage drop generated at the resistor R0-n from the cell potential appears on the second monitor terminal DV3.

Under the control of the control unit 14, the multiplexer 11 selects these voltages and simultaneously inputs them to two voltage measuring circuits 12a, 12b.

More specifically, as for the voltage measurement of the battery cell VBAT1, the voltage between the first monitor terminal V1 and the terminal VSS is inputted to the first voltage measuring circuit 12a, while the voltage between the second monitor terminal DV1 and the terminal VSS is inputted to the second voltage measuring circuit 12b.

As for the voltage measurement of the battery cell VBAT2, the voltage between the first monitor terminals V2 and V1 is inputted to the first voltage measuring circuit 12a, while the voltage between the second monitor terminal DV2 and the first monitor terminal V1 is inputted to the second voltage measuring circuit 12b.

As for the voltage measurement of the battery cell VBAT3, the voltage between the first monitor terminals V3 and V2 is inputted to the first voltage measuring circuit 12a, while the voltage between the second monitor terminal DV3 and the first monitor terminal V2 is inputted to the second voltage measuring circuit 12b.

Then, these voltages are measured by the first voltage measuring circuit 12a and the second voltage measuring circuit 12b simultaneously. As the measurement accuracy can be confirmed since the comparator 13 comparing these voltages with each other, it is possible to detect the voltages of the respective battery cells VBAT1 to VBAT3 with high accuracy.

Additionally, by performing predetermined processing on respective detected voltages, it is possible to execute the operation check of equalizing the voltages of the respective battery cells VBAT1 to VBAT3 and the disconnection detection in the circuit.

Figure 2B:
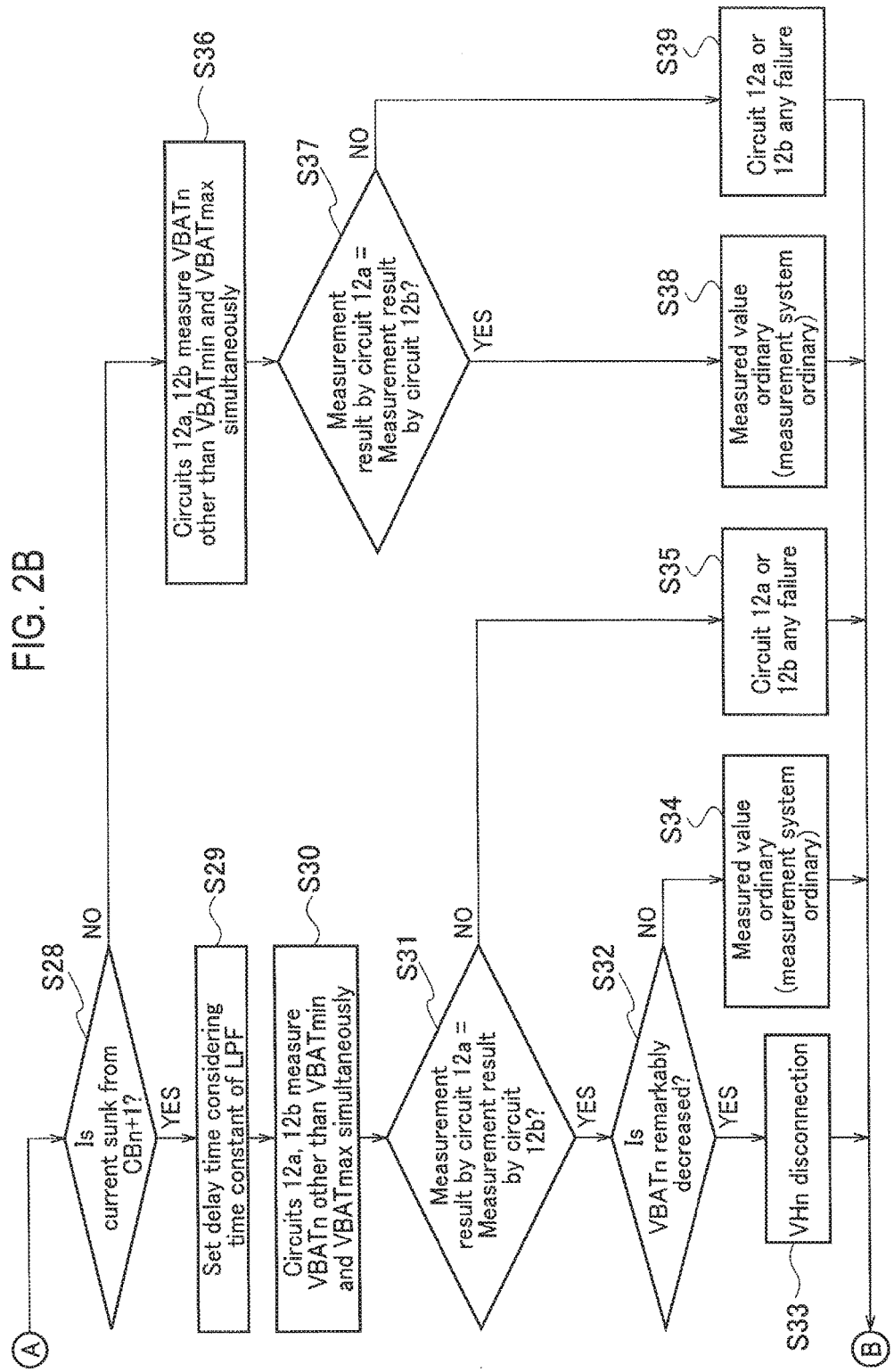

The detailed operation example of the battery monitoring system S1a including the above-constructed input circuit C will be described with reference to the flowchart of FIGS. 2A and 2B, later.

Next, the processing procedure of the battery monitoring process executed by the battery monitoring system S1a according to the embodiment will be described with reference to the flowchart of FIGS. 2A and 2B.

When the battery monitoring process is started, it is firstly judged at step S10 whether or not the battery cell VBATmin or the battery cell VBATmax is selected by the multiplexer 11. Specifically, in the configuration example illustrated in FIG. 1, it is judged whether or not the battery cell VBAT1 as the battery cell VBATmin or the battery cell VBAT3 as the battery cell VBATmax is selected.

Then, if the judgment at step S10 is "Yes", the process goes to step S11.

At step S11, it is judged whether or not FETmin or FETmax has been on-controlled. Specifically, in the configuration example illustrated in FIG. 1, it is judged whether or not the FET1 as the FETmin or the FET3 as the FETmax has been turned on.

If the judgement at step S11 is "Yes", the process goes to step S12 to set a delay time taking into account the above-described time constant of the LPF and thereafter, the process goes to step S40.

At step S40, the first voltage measuring circuit 12a and the second voltage measuring circuit 12b measure the voltage of the battery cell VBATmin or the battery cell VBATmax simultaneously.

At next step S13, it is determined whether or not a measurement result by the first voltage measuring circuit 12a is equal to a measurement result by the second voltage measuring circuit 12b.

If the judgment at step S13 is "Yes", that is, in a case of "the measurement result by the first voltage measuring circuit 12a=the measurement result by the second voltage measuring circuit 12 b", the process goes to step S14 where it is judged that a failure occurs in the FETmin or the FETmax and subsequently, the process is ended.

The above judgement rests on the following basis. For example, as illustrated in FIG. 1, at the time of detecting the voltage of the battery cell VBAT1, a voltage between the first monitor terminal V1 and the terminal VSS of the ground potential is inputted to the first voltage measuring circuit 12a, while a voltage between the second monitor terminal DV1 and the terminal VSS of the ground potential is inputted to the measuring circuit 12b. In the situation where the FET1 is turned on, the potential appearing on the second monitor terminal DV1 should be lower than the potential appearing on the first monitor terminal V1 in the ordinary state because of the presence of a voltage drop by the resistor R0-1. Despite this, the fact that the judgment at step S13 proves the relationship of "the measurement result by the first voltage measuring circuit 12a=the measurement result by the second voltage measuring circuit 12b" means that the FET1 is not turned on due to any failure about the operation of the FET1. The failure judgment at step S14 is based on such an estimation mentioned above.

On the other hand, if the judgment at step S13 is "No", it is judged at step S15 that the FETmin or the FETmax is ordinary operated, in other words, the measuring system is in the ordinary state and therefore, the process is completed.

By selecting the battery cell VBAT at step S10, the above-mentioned judgment process is performed for each FET, that is, the presence/absence of a failure is determined with respect to each FET.

Returning to step S11, if the judgment is "No", that is, when it is judged that the FETmin or the FETmax is in an off state, the process goes to step S16.

At step S16, the first voltage measuring circuit 12a and the second voltage measuring circuit 12b measure the voltage of the battery cell VBATmin or the battery cell VBATmax simultaneously.

At next step S17, it is determined whether or not the measurement result by the first voltage measuring circuit 12a is equal to the measurement result by the second voltage measuring circuit 12b.

If the judgment at step S17 is "Yes", then the process goes to step S18 where it is judged whether or not the voltage of the battery cell VBATn is remarkably decreased (extreme reduction in voltage).

If the judgment at step S18 is "Yes", it is judged that a disconnection arises in the detection line VHmin or the detection line VHmax. That is, in the configuration example illustrated in FIG. 1, it is judged that the disconnection arises in the detection line VH0 as the detection line VHmin or the detection line VH3 as the detection line VHmax and thereafter, the process is ended.

If the judgment at step S18 is "No", it is judged that the measured value is ordinary (that is, the measuring system is in an ordinary state) and the process is ended.

Returning to step S17, if the judgment at step 17 is "No", the process goes to step S21 where it is judged that any failure arises in either the measuring circuit 12a or the measuring circuit 12b and subsequently, the process is ended.

By selecting the battery cell VBAT at step S10, the above-mentioned process is performed for each detection line, that is, the presence/absence of a disconnection is determined with respect to each detection line.

Returning to step S10, if the judgment is "No", the process goes to step S22 where it is judged whether or not the FETn has been on-controlled.

Then, if the judgment at step S22 is "Yes", the process goes to step S23 to set a delay time taking into account the above-described time constant of the LPF and thereafter, the process goes to step S24.

At step S24, the first voltage measuring circuit 12a and the second voltage measuring circuit 12b measure the voltage of the battery cell VBATn other than the battery cell VBATmin and the battery cell VBATmax simultaneously.

At next step S25, it is determined whether or not a measurement result by the first voltage measuring circuit 12a is equal to a measurement result by the second voltage measuring circuit 12b.

If the judgment at step S25 is "Yes", that is, in case of "the measurement result by the first voltage measuring circuit 12a=the measurement result by the second measuring circuit 12 b", the process goes to step S26 where it is judged that any failure occurs in the operation of the FETn and subsequently, the process is ended.

The above judgement rests on the following basis. For example, as illustrated in FIG. 1, at the time of detecting the voltage of the battery cell VBAT2, a voltage between the first monitor terminal V2 and the first monitor terminal V1 is inputted to the first voltage measuring circuit 12a, while a voltage between the second monitor terminal DV2 and the first monitor terminal V1 is inputted to the second voltage measuring circuit 12b. In the situation where the FET2 as the FETn is turned on, the potential appearing on the second monitor terminal DV2 should be lower than the potential appearing on the first monitor terminal V2 in the ordinary state because of the presence of a voltage drop by the resistor R0-2. Despite this, the fact that the judgment at step S25 proves the relationship of "the measurement result by the first voltage measuring circuit 12a=the measurement result by the second voltage measuring circuit 12b" means that the FETn is not turned on due to any failure about the operation of the FETn. The failure judgment at step S26 is based on such an estimation mentioned above.

On the other hand, if the judgment at step S25 is "No", the process goes to step S27 where it is judged that the FETn is ordinary operated, in other words, the measuring system is in the ordinary state and therefore, the process is ended.

By selecting the battery cell VBAT at step S10, the above-mentioned judgment process is performed for each FETn, that is, the presence/absence of a failure is determined with respect to each FETn.

If the judgment at step S22 is "No", the process goes to step S28.

At step S28, it is judged whether or not the current sink has been turned on through the drive terminal CBn+1 by the operation of the disconnection detecting sink circuit included in the driving unit 10.

If the judgment at step S28 is "Yes", the process goes to step S29 to set a delay time taking into account the above-described time constant of the LPF and thereafter, the process goes to step S30.

At step S30, the two voltage measuring circuits 12a, 12b measure the voltage of the battery cell VBATn other than the battery cell VBATmin or the battery cell VBATmax simultaneously.

At next step S31, it is determined whether or not the measurement result by the first voltage measuring circuit 12a is equal to the measurement result by the second voltage measuring circuit 12b.

If the judgment at step S31 is "Yes", then the process goes to step S32 where it is judged whether or not the voltage of the battery cell VBATn is remarkably decreased.

If the judgment at step S32 is "Yes", the process goes to step S33 where it is judged that a disconnection arises in the detection line VHn. That is, in the configuration example illustrated in FIG. 1, it is judged that the disconnection arises in the detection line VH2 as the detection line VHn and thereafter, the process is ended.

If the judgment at step S32 is "No", the process goes to step S34 where it is judged that the measured value is ordinary (that is, the measuring system is in an ordinary state) and the process is ended.

By selecting the battery cell VBAT at step S10, the above-mentioned process is performed for each detection line VHn, that is, the presence/absence of a disconnection is determined with respect to each detection line.

While, if the judgment at step S31 is "No", the process goes to step S36 where it is judged that any failure arises in either the first voltage measuring circuit 12a or the second voltage measuring circuit 12b and subsequently, the process is ended.

Returning to step S28, if the judgment at this step is "No", the process goes to step S36.

At step S36, the first voltage measuring circuit 12a and the second voltage measuring circuit 12b measure the voltage of the battery cell VBATn other than the battery cell VBATmin and the battery cell VBATmax simultaneously.

At next step S37, it is determined whether or not the measurement result by the first voltage measuring circuit 12a is equal to the measurement result by the second voltage measuring circuit 12b.

If the judgment at step S37 is "Yes", then the process goes to step S38 where it is judged that the measured value is ordinary (that is, the measuring system is in an ordinary state) and the process is ended.

While, if the judgment at step S37 is "No", the process goes to step S39 where it is judged that any failure arises in either the first voltage measuring circuit 12a or the second voltage measuring circuit 12b and subsequently, the process is ended.

Next, the equalization diagnosis process executed in the battery monitoring system S1a according to the embodiment will be described with reference to FIGS. 3 to 5. The equalization diagnosis process shows the details of operations executed at respective steps S11, S12, S40, S13, S14 (or S15), S22, S23, S24, S25 and S26 (or S27) in the flowchart of FIGS. 2A and 2B described above. Although the illustrated embodiment emphasizes and describes means for confirming whether or not an FET for equalization can be on-controlled, the means may be attained by confirming whether or not an FET for equalization can be off-controlled.

Steps S100 to S102 as the processing procedures of the equalization diagnosis process for the battery cell VBAT2 correspond to steps S22, S23, S24, S25, and step S26 (or S27) of the flowchart illustrated in FIG. 2A.

Figure 3:
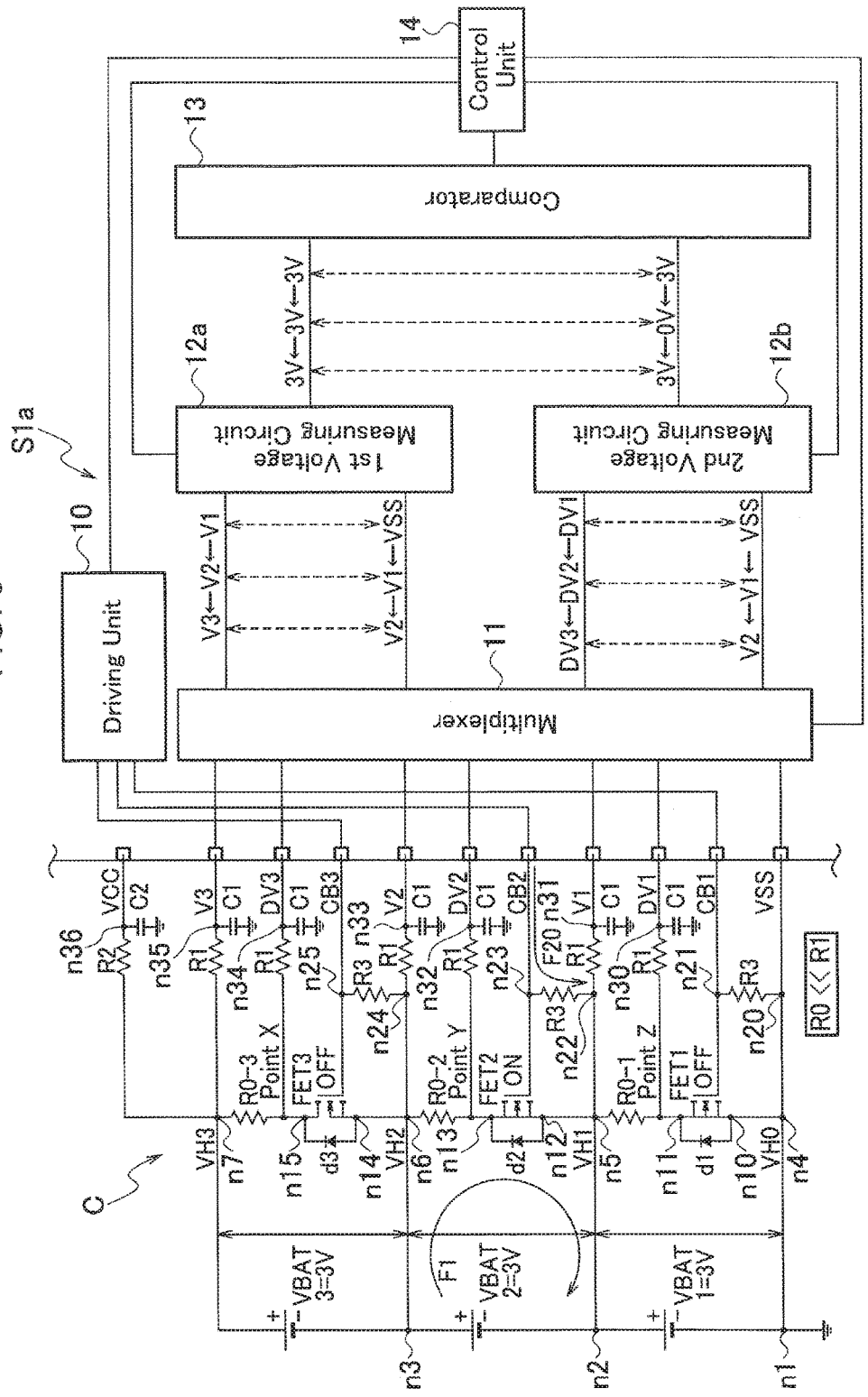
FIG. 3 is a circuit diagram illustrating the overall configuration of the battery monitoring system according to the embodiment and the state of an equalizing current of a battery cell VBAT2.

In the equalization diagnosis process for the battery cell VBAT2, as illustrated in FIG. 3, attention is focused on current flows F1, F20 in the input circuit C mainly.

First, at step S100 (corresponding to step S22 of FIG. 2A), it is executed to allow the FET driving circuit of the driving unit 10 to generate a voltage at the drive terminal CB2 in order to turn on the FET2. Thus, the FET 2 is turned on.

Next, at step S101 (corresponding to steps S23 and S24 of FIG. 2A), a potential difference between the first monitor terminal V2 and the first monitor terminal V1, which is measured by the first voltage measurement circuit 12a under condition that the FET2 is turned on, becomes the voltage of the battery cell VBAT2.

In addition, a potential difference between the second monitor terminal DV2 and the first monitor terminal V1 measured by the second voltage measurement circuit 12b becomes approximately 0 V.

As for the measurement, the time constant of the LPF of the first voltage measuring circuit 12a is equal to the time constant of the LPF of the second voltage measuring circuit 12b. Therefore, after the lapse of the delay time in consideration of a voltage change time corresponding to the time constants, both potential differences are measured by the first voltage measuring circuit 12a and the second voltage measuring circuit 12h simultaneously.

Then, at step S102 (corresponding to steps S25 and S26 (or S27) of FIG. 2A), the comparator 13 compares the output of the FET drive circuit (or its control signal) with the measurement results by the first voltage measuring circuit 12a and the second voltage measuring circuit 12b.

As a result, it becomes possible to confirm the reliability (accuracy) of the operation of the FET2.

More specifically, if such conditions as illustrated in the table of FIG. 5 are satisfied, it is judged that the FET2 is ordinary operated. In contrast, if the conditions are not satisfied, it is judged that any failure arises in an on or off function of the FET.

Besides, with the similar processing procedures, it is possible to perform the equalization diagnosis of the battery cell VBATn (n: an integer) and also possible to judge the presence/absence of a failure of the FETn (n: an integer).

Figure 7:
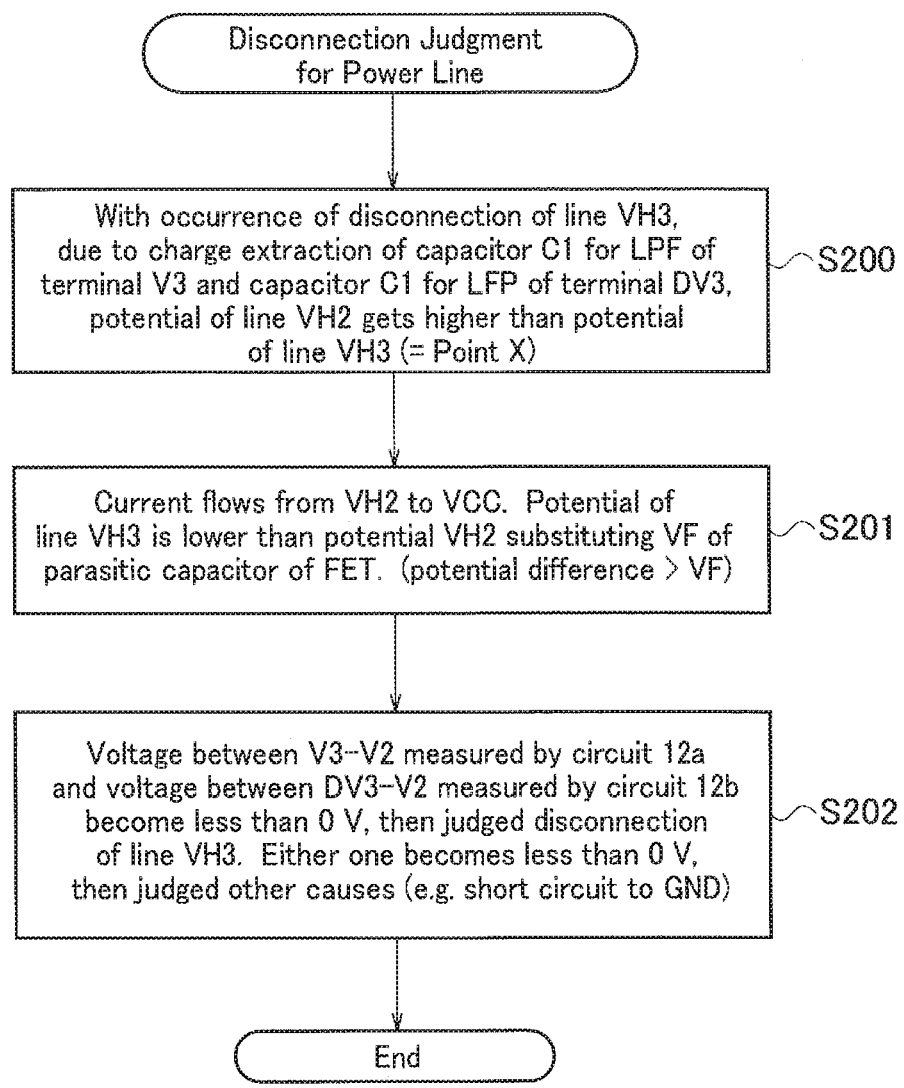
FIG. 7 is a flowchart illustrating flow of an operation that enables a disconnection judgment process of the power line, which is executed in the battery monitoring system according to the embodiment.
Figure 8:
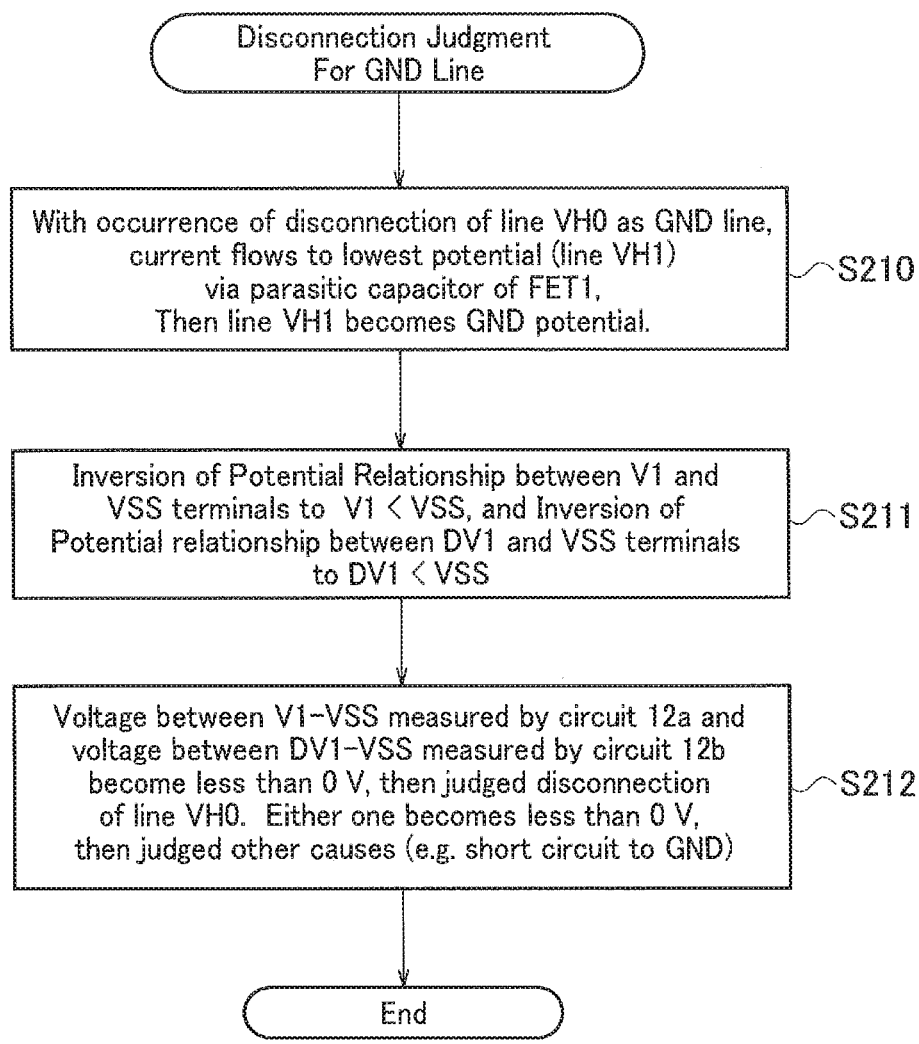
FIG. 8 is a flow chart illustrating flow of an operation that enables a disconnection judgment process of the ground line, which is executed in the battery monitoring system according to the embodiment.

Next, the power line/ground line disconnection judgment process executed by the battery monitoring system S1a according to the embodiment will be described with reference to FIGS. 6 to 8. The judgment process of a disconnection in the power line/ground line shows the details of operations executed at respective steps S11, S16, S17, S18, and step S19 (or S 20) in the flowchart of FIG. 2A described above.

Figure 6:
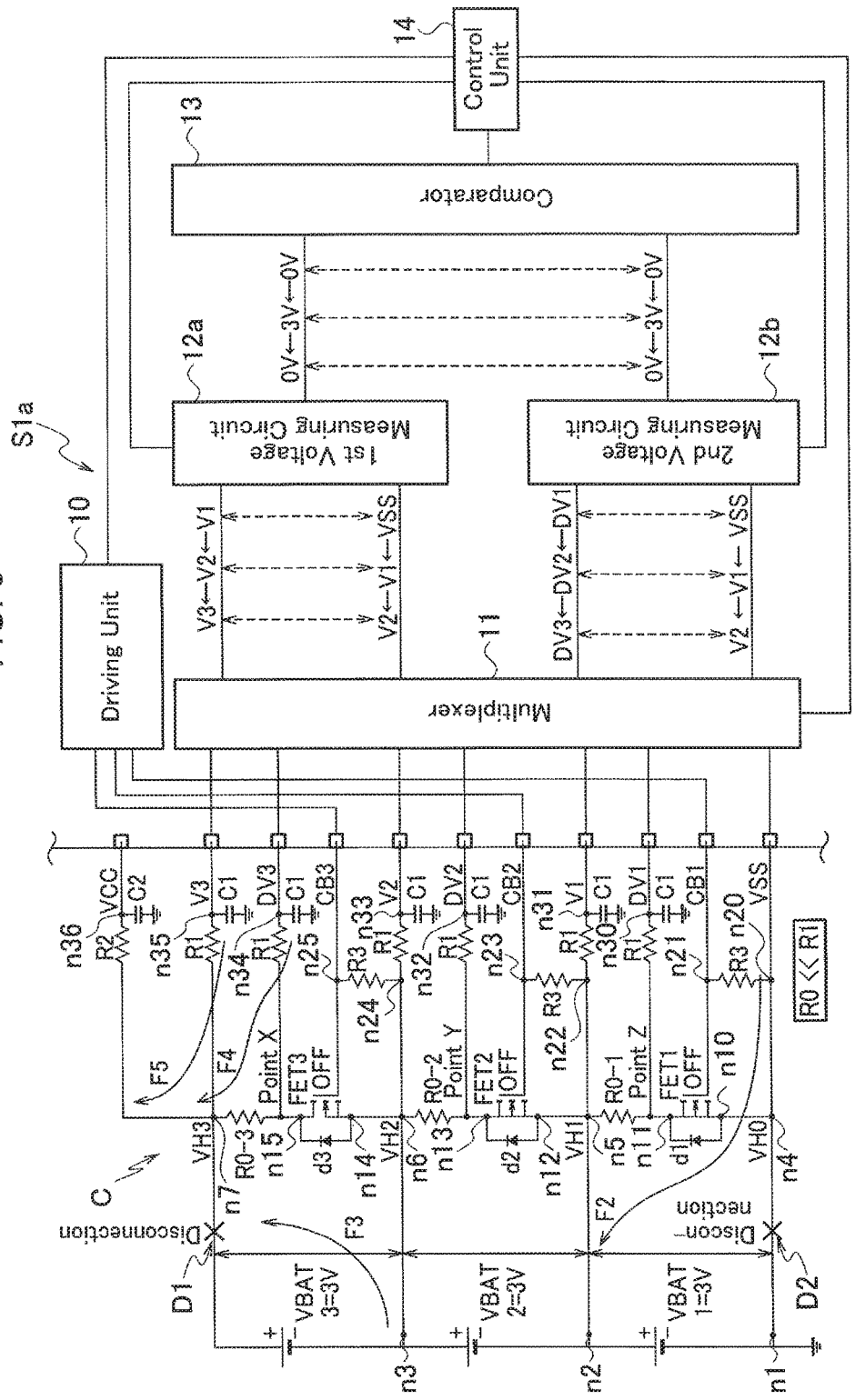
FIG. 6 is a circuit diagram illustrating the overall configuration of the battery monitoring system according to the embodiment and a state of a current when a power line and a ground line are disconnected.

In the power line/ground line disconnection judgment process, as illustrated in FIG. 6, attention is focused on current flows F2 to F5 in the input circuit C mainly. Assume here, a disconnection occurs at a point D1 in the power line (detection line VH3) or a point D 2 in the ground line (detection line VH0) of the input circuit C.

Referring to the flowchart illustrated in FIG. 7, first, the operation for enabling the judgment of a disconnection in the power line will be described.

At step S200 corresponding to the initial state of the system under condition that the power line has been disconnected, since a disconnection is generated at the point D1 of the detection line VH3 as the supply source of the circuit power supply VCC, the electric charges are drawn from the capacitor C1 constituting the LPF for the first monitor terminal V3 and the capacitor C1 constituting the LPF for the second monitor terminal DV3 (see arrows F4, F5).

As a result, the potential of the detection line VH2 becomes higher than the potential of the detection line VH3 (=point X).

Thus, as illustrated at step S201, a current flows from the detection line VH2 to the circuit power supply VCC as the result of such a situation as illustrated at step S200 (see arrow F3).

At this time, the potential of the detection line VH 3 (or the point X) becomes lower than the potential of the detection line VH2 by the voltage (forward voltage) VF of the parasitic diode d3 of the FET 3 or more voltage.

Consequently, as illustrated at step S202, the voltage measurement result between the terminals V3-V2 measured by the first voltage measuring circuit 12a exhibits less than 0 V, while the voltage measurement result between the terminals DV3-V2 measured by the second voltage measuring circuit 12b exhibits less than 0 V as well.

Thus, due to the operation of simultaneously measuring an identical voltage through two measurement paths, these voltage measuring circuits are brought into condition of complementing their measuring functions with each other.

Under this condition, as the situation affording the above-mentioned measurement results comes from only a disconnection of the detection line VH3, it can be judged that the detection line VH3 is being disconnected.

On the other hand, if either the measurement result through one path or the measurement result through another path exhibits less than 0 V, it could be judged that such a phenomenon is not derived from a disconnection of the detection line VH3 but it comes from any other reason, for example, a short circuit to the ground in the path(s).

Next, the operation for enabling the judgment of a disconnection in the ground line will be described by the flowchart illustrated in FIG. 8.

At step S210, it is assumed that a disconnection occurs at the point D2 of the detection line VH0 as a ground potential (GND). Due to the disconnection of the point D2, the current flowing in the battery monitoring system S1a flows toward a lower potential (i.e. the detection line VH1) through the parasitic diode d1 of the FET 1 or the like (see arrow F2 in FIG. 6). As a result, the ground of the circuit becomes the detection line VH1.

Then, as illustrated at step S211, the relationship between the potentials of the terminal V1 and the terminal VSS is inversed to meet the relationship of "potential of V1<potential of VSS" with the result of step S210. Also, the relationship between the potentials of the terminal DV1 and the terminal VSS is inversed to meet the relationship of "potential of DV1 <potential of VSS".

Additionally, as illustrated at step S211, the voltage measurement result between the terminal V1 and the terminal VSS measured by the first voltage measuring circuit 12a exhibits less than 0 V, while the voltage measurement result between the terminal DV1 and the terminal VSS measured by the second voltage measuring circuit 12b exhibits less than 0 V as well.

Thus, due to the operation of simultaneously measuring an identical voltage through two measurement paths, these voltage measuring circuits are brought into condition of complementing their measuring functions with each other.

Under this condition, as the situation affording the above-mentioned measurement results comes from only a disconnection of the detection line VH0, it can be judged that the detection line VH0 is being disconnected.

On the other hand, if either the measurement result through one path or the measurement result through another path exhibits less than 0 V, it could be judged that such a phenomenon is not derived from a disconnection of the detection line VH0 but it comes from any other reason, for example, a short circuit to the ground in the path(s).

Next, the intermediate line disconnection judgment process executed by the battery monitoring system S1a according to the embodiment will be described with reference to FIGS. 8 and 9. The intermediate line disconnection judgment process shows the details of operations executed at respective steps S22, S28, S29, S30, S31, S32, and step S33 (or S34) in the flowchart of FIGS. 2A and 2B described above.

Figure 9:
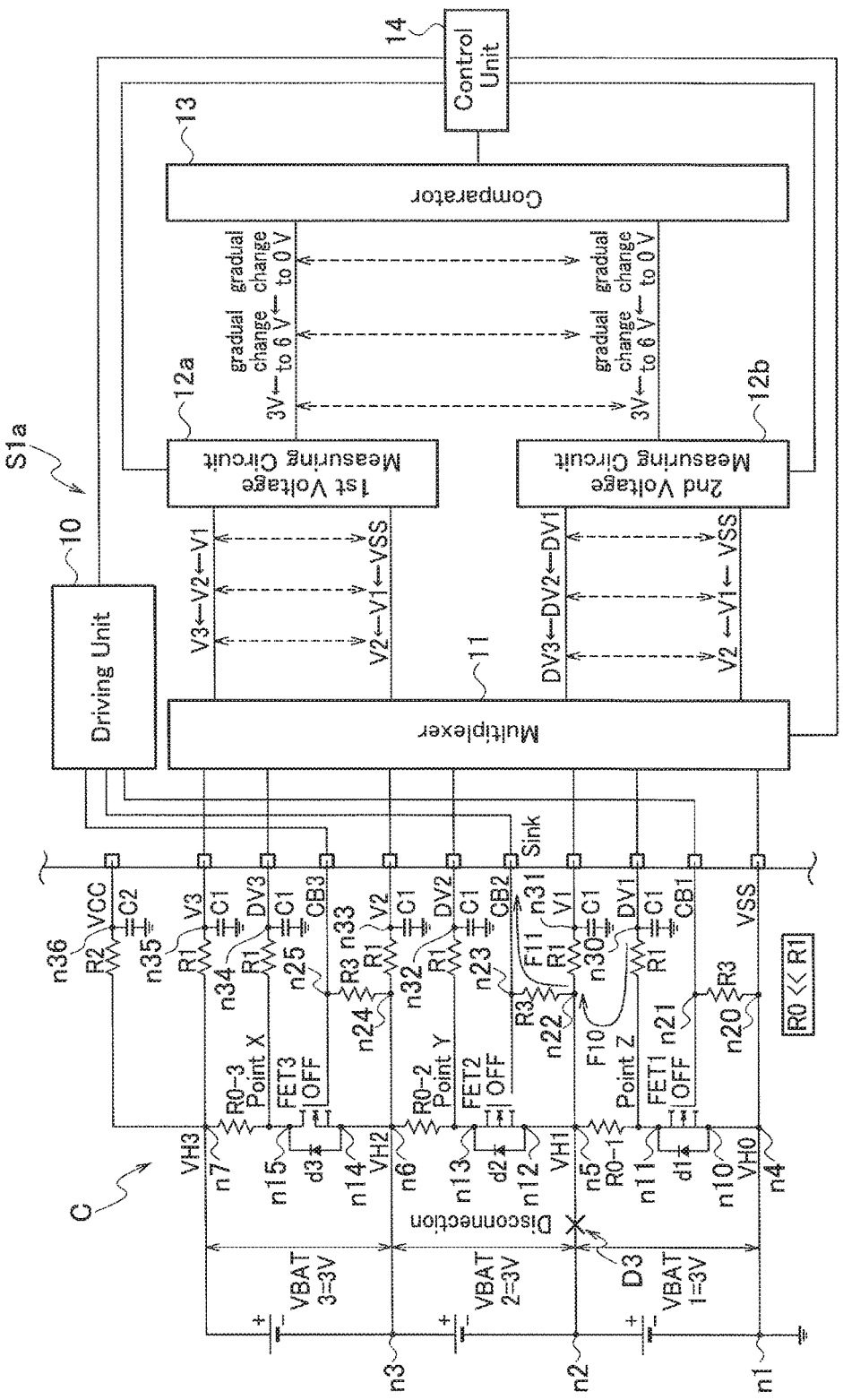
FIG. 9 is a circuit diagram illustrating the overall configuration of the battery monitoring system according to the embodiment and a state of a current when an intermediate cell-voltage detection line is disconnected.

In the intermediate line disconnection judgment process, as illustrated in FIG. 9, attention is focused on current flows F10 to F11 in the input circuit C mainly. Assume here, a disconnection occurs at a point D3 in the intermediate line (detection line VH1) other than the power line and the ground line of the input circuit C.

Figure 10:
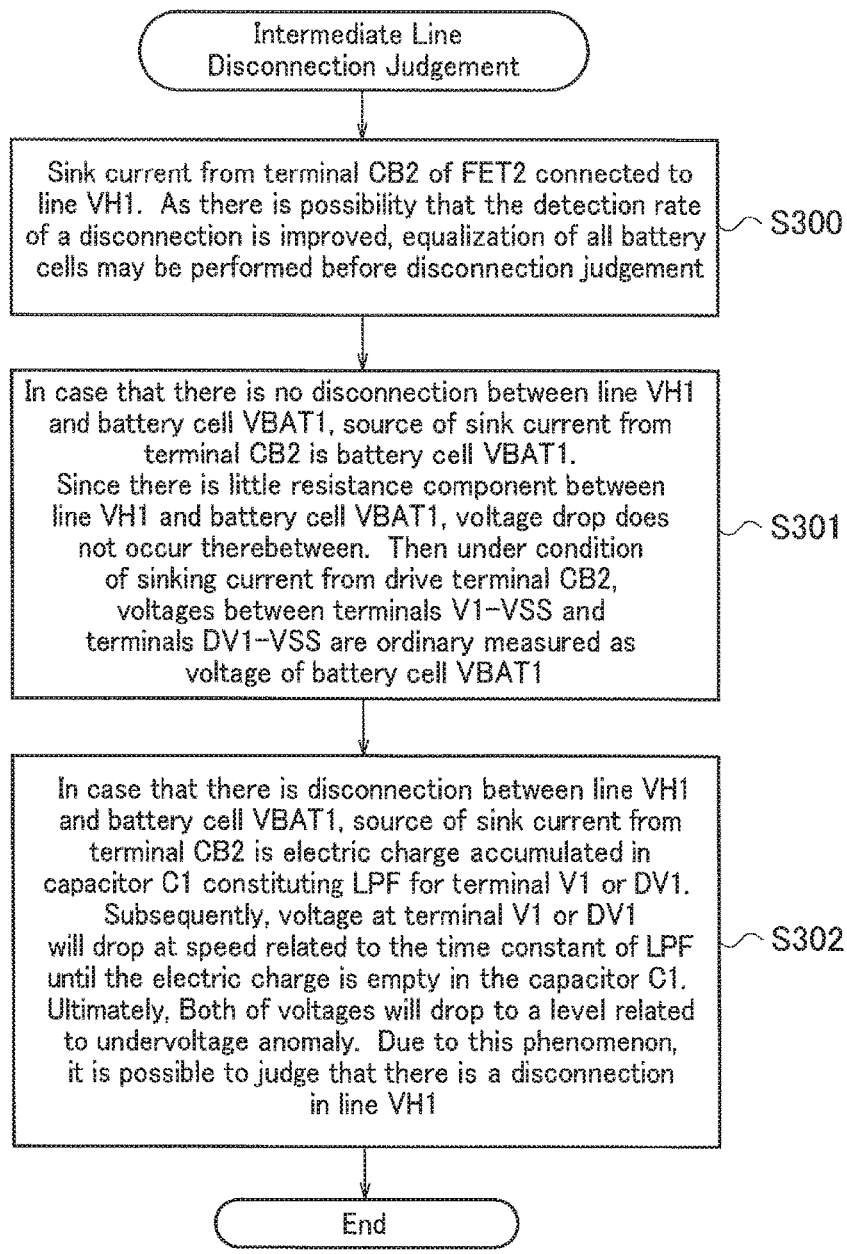
FIG. 10 is a flow chart illustrating flow of an operation that enables an intermediate line disconnection judgment process executed in the battery monitoring system according to the embodiment.

Referring to the flowchart illustrated in FIG. 10, first, the operation for enabling the judgment of a disconnection in the intermediate line will be described.

At step S300, it is executed to sink a current through the drive terminal CB2 of the FET 2, which is connected to the detection line VH1.

Besides, as there is a possibility that the detection rate of a disconnection is improved if performing the equalization for all the battery cells before the disconnection detecting process, the equalization of all the battery cells may be performed before step S300.

This is because, the voltage of a disconnected battery cell becomes about an intermediate potential of the two battery cells VBAT positioned above and below the disconnected line, as viewed from the first voltage measurement circuit 12a and the second voltage measurement circuit 12b side and the measure voltages of the battery cells positioned above and below an apparent disconnected detection line become an average of the two battery cells VBAT. In the disconnection detecting method of the embodiment, by the sink operation through the terminal CBn, since the voltage detection result that changes more significantly than before the sink exhibits high detectability, there is a possibility that if equalizing all the battery cells, the voltages among the terminals Vn before the sink operation through the terminal CBn are balanced, so that the detectability can be improved consequently.

In a case that there is no disconnection in the detection line VH1, as described at step S301, the voltages between the terminals V1-VSS and between the terminals DV1-VSS are ordinary measured as the voltage of the battery cell VBAT1.

When there is no disconnection between the detection line VII and the battery cell VBAT1, the power source of a sink current under condition of sinking the current from the drive terminal CB2 of the FET2 settles into the battery cell VBAT1. Then, since there is little resistance component between the detection line VH1 and the battery cell VBAT1, it is supposed that a voltage drop does not occur therebetween.

Therefore, even during the sinking of current from the drive terminal CB2 of the FET2, the voltages between the terminals V1-VSS and between the terminals DV1-VSS are ordinary measured as the voltage of the battery cell VBAT1. (If the resistance value of the detection line couldn't be ignored, the judgment would be carried out in consideration of the resistance value, if necessary.)

On the other hand, if the detection line VH1 is disconnected, as described at step S302, the power source of a sink current under condition of sinking the current from the drive terminal CB 2 of the FET2 is not the battery cell VBAT1 but the electric charge accumulated in the capacitor C1 constituting the LPF (low pass filter) for the first monitor terminal V1 or the second monitor terminal DV1 (see arrow F10).

Subsequently, the voltage at the first monitor terminal V1 or the second monitor terminal DV1 will drop at a speed related to the time constant of the LPF until the electric charge is empty in the capacitor C1.

Then, ultimately, both of the voltages will drop to a level related to an undervoltage anomaly. Due to this phenomenon, it is possible to judge that there is a disconnection in the detection line VH1. Alternatively, as a method of judging the presence/absence of a disconnection before both voltages drop greatly, it may be performed to compare one voltage value before the sinking operation with another voltage value after the sinking. In this case, if there is a change between these voltage values before and after the sinking operation simply, it would be judged that there is a disconnection in the detection line VH1.

Figure 11:
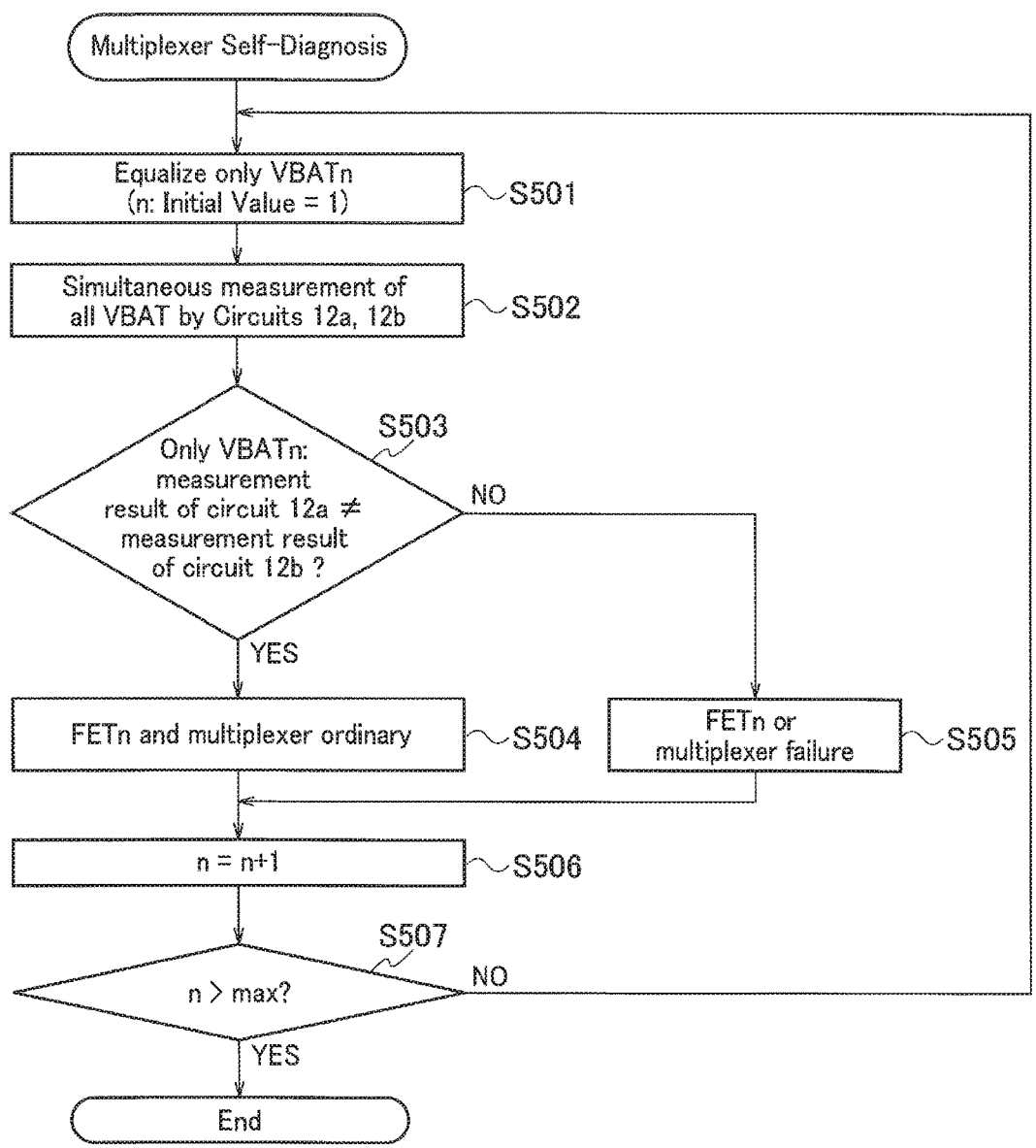
FIG. 11 is a flowchart illustrating processing procedure of a self-diagnosis process of a multiplexer, which is executed in the battery monitoring system according to the embodiment.
Figure 12:
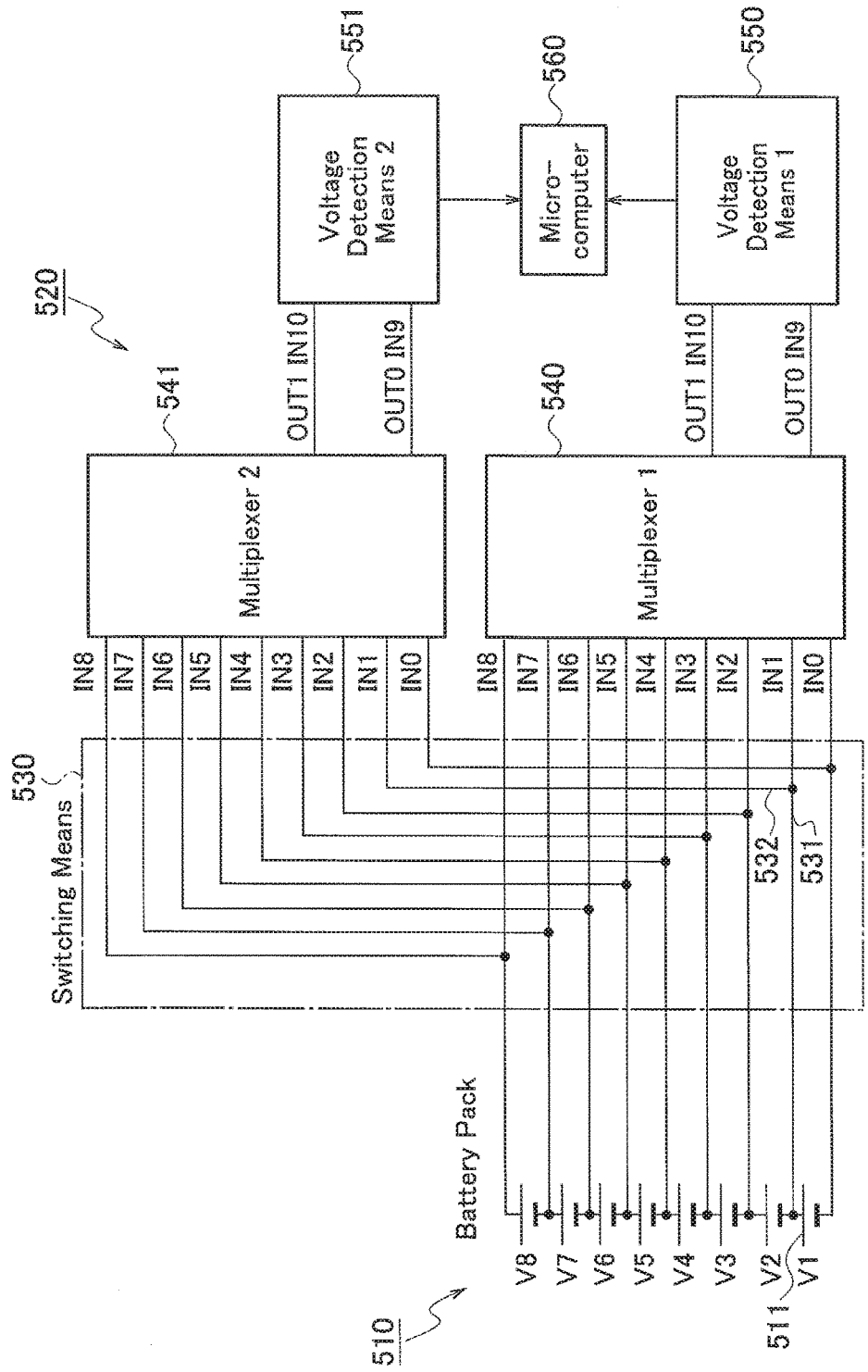
FIG. 12 is a circuit diagram illustrating an overall configuration of a voltage detection device of a conventional example.
Figure 13:
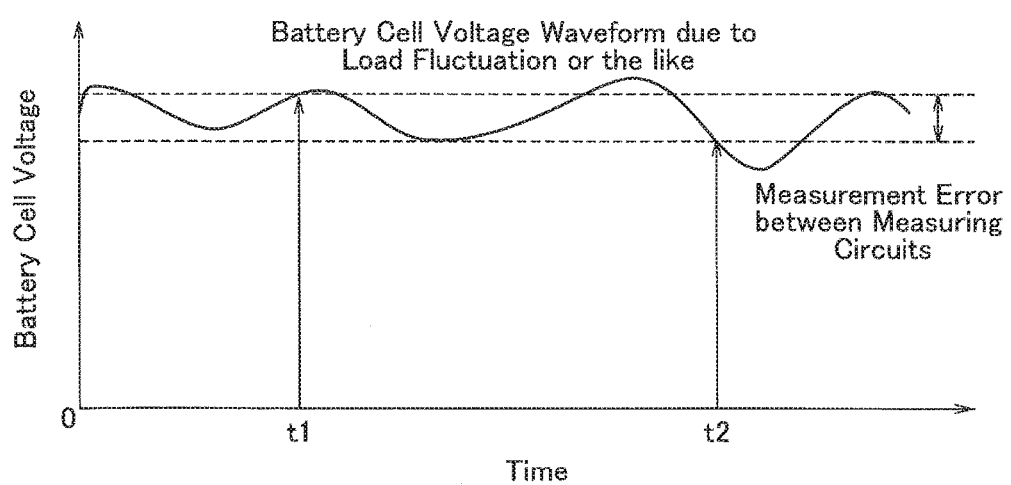

Next, the processing procedures of self-diagnosis of the multiplexer 11 applied to the battery monitoring system S1a according to the embodiment will be described with reference to the flowchart of FIG. 11.

When the self-diagnosis process of the multiplexer 11 is started, it is first executed to equalize only the battery cell VBATn (n: an integer, initial value: 1) at step S501, and the process goes to step S502.

At step S502, the voltage measuring circuits 12a, 12b measure all the battery cells VBAT simultaneously.

At next step S503, it is executed from the measurement results of all the battery cells VBAT to judge whether or not the measurement result of the first voltage measurement circuit 12a does not coincide with the measurement result of the second voltage measurement circuit 12b for only the equalized battery cells VBATn.

If the judgment at step S503 is "Yes", the process goes to step S504 where it is judged that the FETn (n: an integer) and the multiplexer 11 itself are ordinary and thereafter, the process goes to step S506.

On the other hand, if the judgment at step S503 is "No", the process goes to step S505 where it is judged that the FETn (n: an integer) or the multiplexer 11 itself has a failure and thereafter, the process goes to step S506.

At step S506, it is executed to increment "n" by "1" and subsequently, the process goes to step S507.

At step S507, it is judged whether or not the number of "n" exceeds the value of "max" (the value of "max" changes depending on the number of batteries to be monitored by the battery monitoring system S1a). If the judgment at step S507 is "Yes", the process is ended. On the other hand, if the judgment at step S507 is "No", the process returns to step S501 and thereafter, the above-mentioned operations will be executed repeatedly.

The above-mentioned self-diagnosis process of the multiplexer 11 may be executed at any time depending on the user's decision in accordance with a using status of the system. By way of example, if the self-diagnosis process is executed within a preparation time at the start of operation of the battery monitoring system S1a, the presence/absence of an erroneous connection of the multiplexer 11 can be briefly confirmed with respect to each battery cell VBATn before measuring the voltages and it is possible to guarantee the measurement operations of the first voltage measuring circuit 12a and the second voltage measuring circuit 12b and the accuracy of their measurement results.

As described above, according to the battery monitoring system S1a according to the embodiment, it is possible to measure the voltage of the battery cell VBATn more accurately than before and also possible to confirm the reliability of the equalization operation and the detection of a disconnection accurately.

In the battery monitoring system S1a according to the embodiment, since one of the first voltage measuring circuit 12a and the second voltage measuring circuit 12b is subject to an intentional voltage fluctuation, it is possible to confirm the reliability of selecting the battery cell by the multiplexer 11.

Additionally, under condition that the battery cells are not equalized, when the latter voltage measuring circuit, which measures the voltage of the same battery cell as the path where the reliability of selecting the battery cell has been confirmed, produces the same result as that of the former voltage measuring circuit, the accuracy of the measurement result is high and therefore, it is possible to confirm the confidences of the first voltage measuring circuit 12a and the second voltage measuring circuit 12b simultaneously.

Although the battery monitoring system according to the embodiment has been described based on the drawings, the present invention is not limited to this and therefore, the constitution of respective components may be replaced with an arbitrary configuration having the same function.

What is claimed is:

1. A battery monitoring system for monitoring a state of a battery pack including n (n: an integer) pieces of battery cells connected in series over a plurality of stages, comprising:
    an input circuit to which respective voltage signals of the battery cells are inputted;
    a multiplexer configured to:
        select a battery cell for voltage detection from the n pieces of battery cells;
        select voltage signals inputted from the input circuit; and
        output the selected voltage signals;
    a first voltage measuring circuit configured to measuring a voltage based on a voltage signal in a first route outputted from the multiplexer;
    a second voltage measuring circuit configured to measure a voltage based on a voltage signal in a second route outputted from the multiplexer, at the same time as measurement of the first voltage measurement circuit;
    a comparator configured to compare a measurement result by the first voltage measuring circuit with a measurement result by the second voltage measuring circuit; and
    a control unit configured on a basis of a comparison result by the comparator to judge at least one of:
        a voltage of each of the battery cells;
        an operation check of equalizing the voltages of the respective battery cells;
        a presence or absence of a disconnection of a detection line of each of the battery cells; and
        a presence or absence of a failure in the multiplexer.

2. The battery monitoring system of claim 1, wherein the input circuit comprises:
    n pieces of FETs constituting equalization switches for equalizing the voltages of the respective battery cells;

n pieces of resistors for equalization, each of which is connected between a drain terminal side of each of the FETs and a positive side of each of the battery cells;

n pieces of first monitor terminals, each of which is connected to a connection point between each of the resistors and the positive side of each of the battery cells and to which the voltage signals in the first route are inputted; and n pieces of second monitor terminals, each of which is connected to a connection point between the drain terminal side of each of the FETs and each of the resistors and to which the voltage signals in the second route are inputted, the first voltage measuring circuit is configured to measure, as the voltage in the first route, a voltage between a terminal of a ground potential and a lowermost stage of the first monitor terminal or a voltage between adjacent upper and lower stages of the first monitor terminals, and the second voltage measuring circuit is configured to measure, as the voltage in the second route, a voltage between the terminal of a ground potential and a lowermost stage of the second monitor terminals or a voltage between adjacent lower stage of the first monitor terminals and upper stage of the second monitor terminals.

3. The battery monitoring system of claim 2, wherein
the input circuit further comprises n pieces of drive terminals each of which is connected to a gate side of each of the FETs, and
a driving unit including a FET drive circuit and a disconnection detecting sink circuit is connected to the drive terminals, and controlled by the control unit.

4. The battery monitoring system of claim 2, wherein
each of the second monitor terminals is configured to:
input a voltage different from a voltage inputted to corresponding first monitor terminal when corresponding FET is turned on by the driving unit, and
input the same voltage as a voltage that appears on corresponding first monitor terminal on a stage to which corresponding second monitor terminal belongs, when corresponding FET is turned off by the driving unit.

5. The battery monitoring system of claim 2, further comprising low pass filters each arranged on an upstream side of each of the first monitor terminals and an upstream side of each of the second monitor terminals, wherein each of the low pass filters has same time constant.

* * * * *